United States Patent
Miquel et al.

(10) Patent No.: US 6,955,544 B2
(45) Date of Patent: Oct. 18, 2005

(54) ELECTRIC POWER DISTRIBUTION BOX COMPRISING A SYSTEM OF COMPACTING THE INTEGRAL ELEMENTS THEREOF

(75) Inventors: Jordi Olle Miquel, Valls (ES); Ignaci Ferran Palau, Valls (ES)

(73) Assignee: Lear Corporation, Southfield, MI (US)

( * ) Notice: Subject to any disclaimer, the term of this patent is extended or adjusted under 35 U.S.C. 154(b) by 16 days.

(21) Appl. No.: 10/709,684

(22) Filed: May 22, 2004

(65) Prior Publication Data

US 2004/0209494 A1 Oct. 21, 2004

(30) Foreign Application Priority Data

Dec. 23, 2002 (ES) .................................. PCT/ES02/00619
Jul. 10, 2003 (WO) .................................. WO 03/056662

(51) Int. Cl.[7] ............................................. H01R 12/00
(52) U.S. Cl. ..................... 439/76.1; 439/74; 439/573; 361/752
(58) Field of Search ......................... 439/76.1, 74, 564, 439/573; 361/752

(56) References Cited

U.S. PATENT DOCUMENTS

| | | | | |
|---|---|---|---|---|
| 4,875,140 A | * | 10/1989 | Delpech et al. | 361/789 |
| 5,018,982 A | * | 5/1991 | Speraw et al. | 439/74 |
| 6,215,667 B1 | * | 4/2001 | Ady et al. | 361/752 |
| 6,249,442 B1 | * | 6/2001 | Watanabe | 361/801 |
| 6,280,202 B1 | * | 8/2001 | Alden et al. | 439/66 |

FOREIGN PATENT DOCUMENTS

JP  1-135090  * 11/1987

* cited by examiner

Primary Examiner—Tho D. Ta
(74) Attorney, Agent, or Firm—Bill C Panagos

(57) ABSTRACT

The invention, electrical distribution box with compacting system for its integral elements, consists of an electrical distribution box, suitable for being used preferably in automobiles, which has the means for insulating the conductor block housed in it, generally made up of several printed circuit boards, and of carrying out a solid fixing between them and the box, so that they react as one to the tensions caused by the vibrations in the vehicle during its operation, preventing it from being affected by said tensions.

11 Claims, 2 Drawing Sheets

ELECTRIC POWER DISTRIBUTION BOX COMPRISING A SYSTEM OF COMPACTING THE INTEGRAL ELEMENTS THEREOF

BACKGROUND OF INVENTION

FIELD OF THE INVENTION

The purpose of the invention consists of providing an electrical distribution box, suitable for being used preferably in automobiles, which has the means of insulating the conductor block located in it, generally made up of several printed circuit boards, and of carrying out a strong fixing between them and the box, so that they react as one to the tensions caused by the vehicle during its operation, preventing its integral parts from being affected by said tensions.

OBJECT OF THE INVENTION

The conventional basic make-up of an electrical distribution box, normally used in automobiles, consists of the use of a box object, appropriately fixed to the chassis of the vehicle, and removably locked by means of a cap. Said object houses a conductor block suitable for carrying out the interconnections of the electrical system, generally in the form of one or more printed circuit boards, the means of electrical connection, for both input and output, as well as other components, fuses, relays, etc., all of which are in this way conveniently insulated and protected from unwanted electrical contacts.

The vibrations the box is subjected to during the operation of the vehicle, cause the fixing means it houses to become loose and gradually lose effectiveness, which causes an increase in the vibrations of said components, exposing them to deterioration of their connections, loosening or even breakage.

This is particularly serious when the printed circuit boards are affected, as these vibrating movements cause tensions in its basic substratum, which are transmitted to the welding points of the conductor material of the circuit, causing it to fracture and as a consequence causing interference in its operation, or even its annulment.

It is on this basis that the invention we are dealing with has been designed.

It is about providing an electrical distribution box, suitable for being used in automobiles or similar vehicles, which has a limited number of means of tightening of mechanical operation for the fixing of the components it houses. These means of tightening of mechanical operation being sufficiently robust so as not to be affected by the vibrations of the box, maintaining an efficient and lasting adjustment for the set of components.

BRIEF DESCRIPTION OF DRAWINGS

These and other qualities and advantages of the invention may easily be obvious to all experts in the art, during the course of the detailed description which follows, which has been carried out in connection with the drawings which are attached and in which an example of practical implementation is shown, currently preferred, of the electrical distribution box which we are dealing with, among other possibilities, constituted on the basis of the teachings of this document, which is given for illustration purposes only and is not binding, and where.

DETAILED DESCRIPTION

Figure 1:
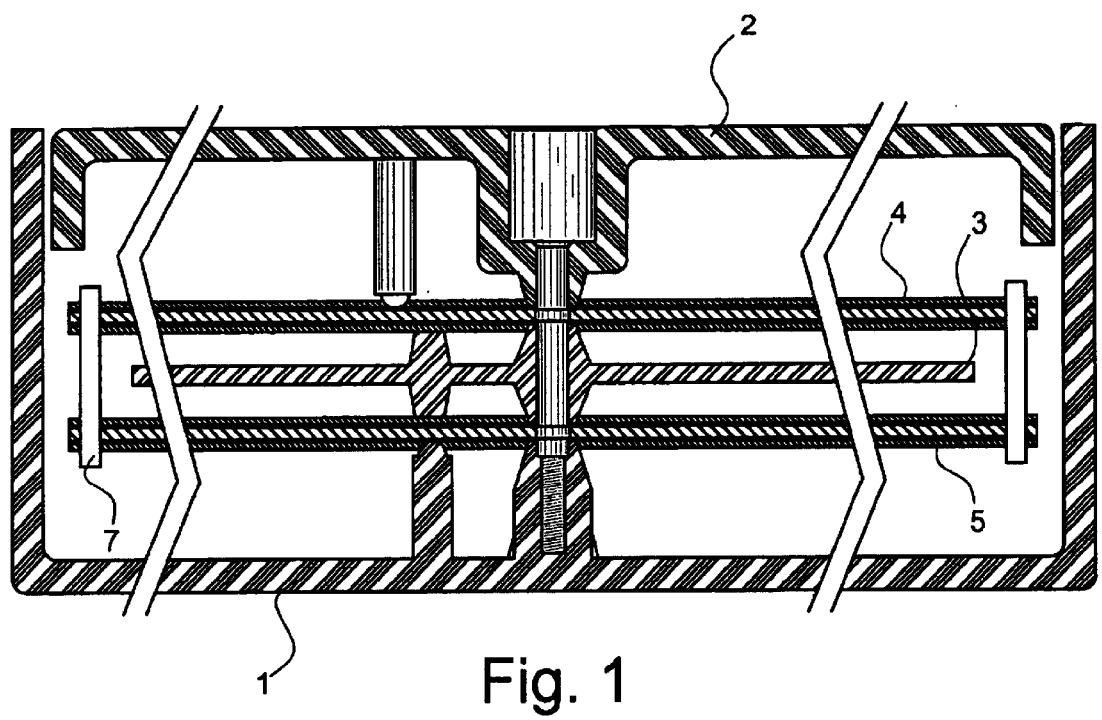
FIG. 1 shows a partially reduced view of the section of a cut made on the vertical plane of an electrical distribution box of an automobile, carried out in accordance with the invention, which passes axially through the device for the tightening and fixing of its parts and of the electrical components it houses, and where their shape and layout can be clearly appreciated.
Figure 2:
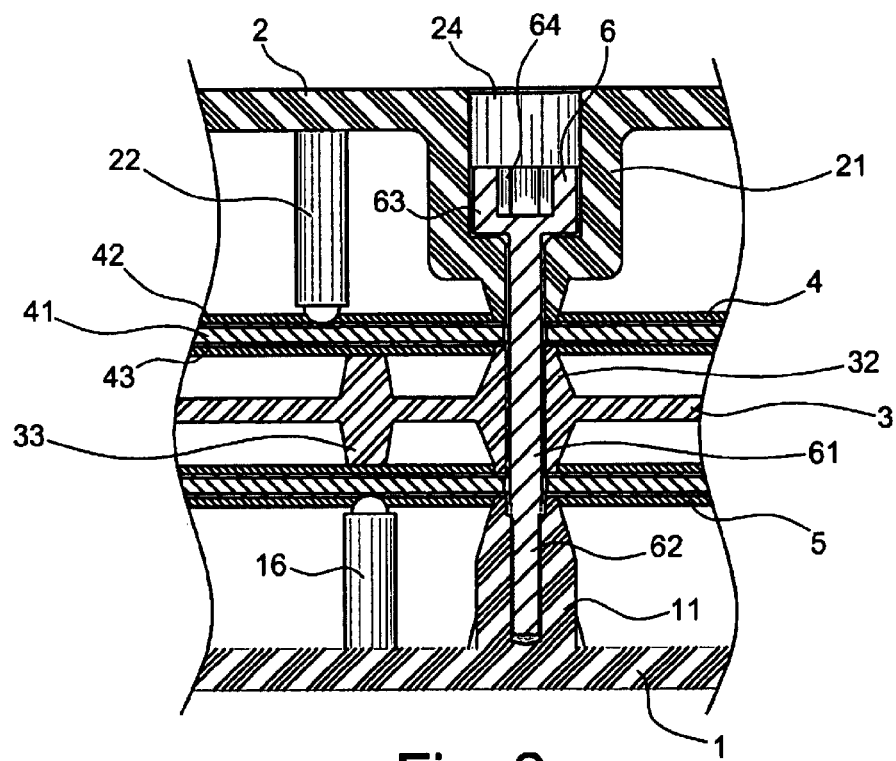
FIG. 2 is a similar view to the previous figure, also on a vertical axial, but is of the detail of the fixing device among its components, is taken on a displaced radially axial plane compared to the axial cut plane in said previous figure.
Figure 3:
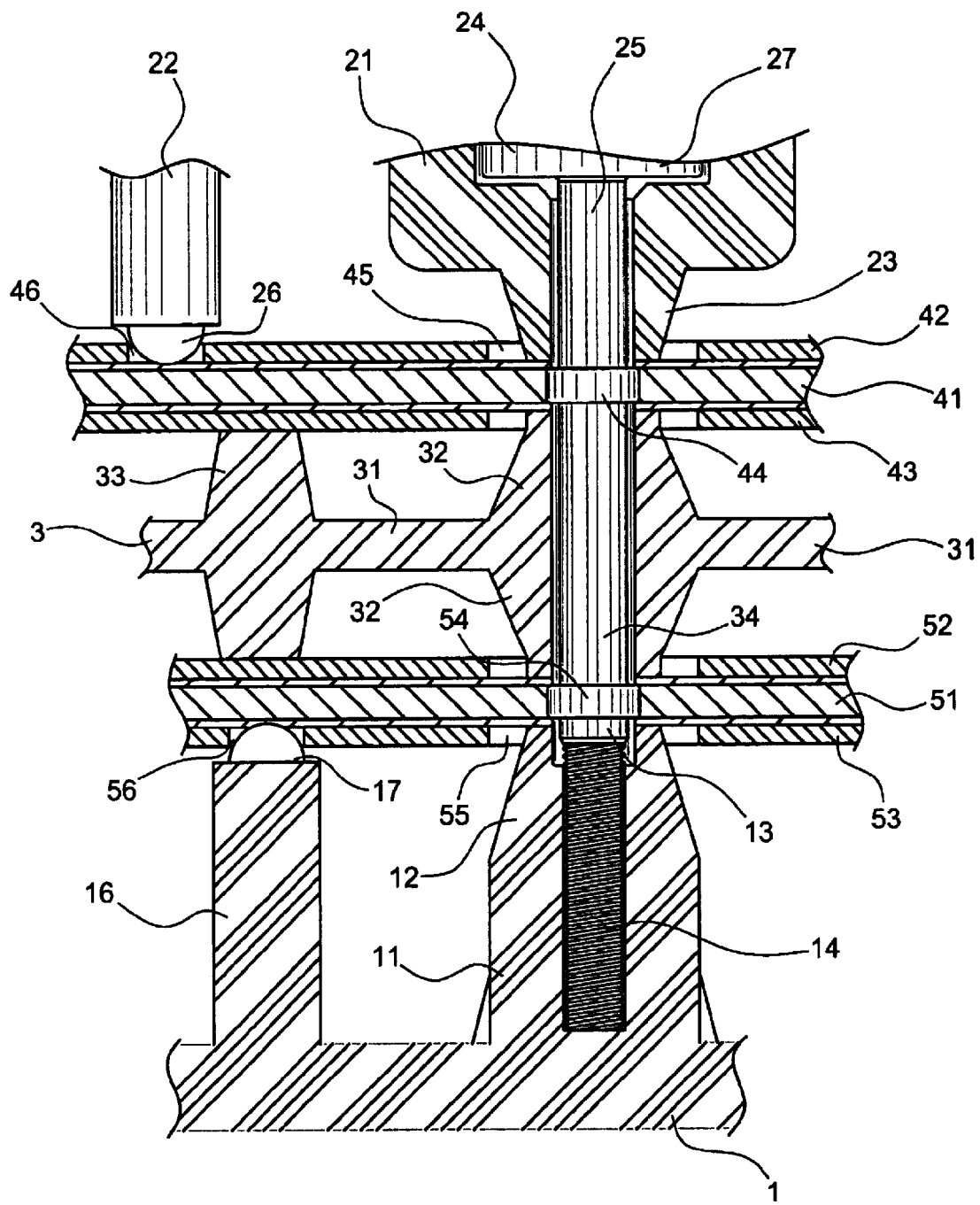
FIG. 3 represents a substantially enlarged and partial detail of the view in FIG. 1, where the shape and disposition of the involved parts referred to can be seen in detail, some of which have been magnified for a better understanding of the whole, particularly the integral conductor material of the printed circuit.

In the drawings and more specifically in FIG. 1, with the number 1 a box object is generally designated which may be parallelepiped, but which does not necessarily have to be so, on which cap 2 fits, and within which both printed circuit boards 4 and 5 are housed, conveniently distanced from each other by means of a separating element 3, and secured at the ends using bracket elements 7; being made up of the box object 1, the cap 2 and the separating element 3 made from a material of low or no electrical conductivity, such as thermoplastic or similar.

Said box object 1 jointly has at least one cylindrical shaft 11, preferably centred on its interior end surface, or strategically distributed on it when there are more than one, with the aim of balancing the tensions which it will stand, which has a trumpet-shaped end, 12, and which axially has a passage 13 which is prolonged by a threaded blind passage 14. And distributed along said interior end surface, and also jointly on it, are a number of cylindrical objects 16, topped by a semi-spherical stub 17, and distributed in accordance with the make-up of the printed circuit housed by the box, for a purpose which will be seen later.

Cap 2, which as has been stated previously is suitable to be tightly housed within the box object 1, has a cylindrical shaft 21, of a diameter substantially bigger than the diameter of shaft 11 of the box object 1, which it matches up with positionally, which is prolonged by means of a trumpet-shaped portion 23 similar to the trumpet-shaped portion 12 of said cylinder 11. And from the exterior, said shaft 21 has a cylindrical axial passage 24, which is finished off by means of a portion of the same cylindrical shape and of a smaller diameter 25, a diameter which is equal to the diameter of the portion of the cylindrical passage 13 of the shaft 11 of the box object 1. And also on its internal surface it has a number of cylindrical objects 22, finished off by means of a semi-spherical stub 26, and distributed in accordance with the aforementioned makeup of the printed circuit housed by the box.

The separating means or object 3 is formed by a laminated board 31, of a smaller area than the area of the printed circuit boards from which it will be distanced, it has on both surfaces two troncoconic coaxial protuberances among themselves and by way of horns 32, which have an axial cylindrical assistant passage 34 whose diameter is equal to the diameter of the passages 13 and 25 of the body of the box 1 and of the cap 2, respectively. A number of troncoconic protuberances 33 have been distributed on both surfaces, which may or may not be coaxially opposed.

The printed circuit boards 4 and 5, substantially conventional and which are formed from a basic laminated substratum, 41 or 51, non-conductor of electricity, which has a circular passage, 44 or 54, positionally corresponding to the location of the shafts 11 and 21, and whose diameter is slightly bigger than the diameter of the passages 13, 25 and 34, respectively corresponding to the body of the box 1, of the cap 2 and the separating object 3, but less than the exterior perimeter of the edge of their corresponding horns, for a purpose which will be described next. The printed circuits prepared on their surfaces, 42 and 43 or 52 and 53, have a reserve 45 around the circular passage 44, as well as a number of said reserves 46 distributed on the opposite surface to the surface of contact with the separating object 3, and in the position corresponding to the position of the cylindrical objects 16 and 22, so that its stubs, 46 and 56, come into contact with the basic substratum, 41 or 51.

Finally a screw 6, has a cylindrical body 61 suitable for being tightly fitted within the passages 25, 34 and 13 of the shaft 21 the cap 2, the separating object 3, and the shaft 11 of the body of the box 1, and has a length which is less than the total length of said passages, 25, 34 and 13 plus the thickness of the basic substratum 41 and 51 of the printed circuit boards 4 and 5. From one of its ends said body 61 is prolonged by means of a portion of coaxial threaded offshoot, which is suitable for housing a thread on the threaded passage 14 of the shaft 11 of the body of the box 1. At the other end it has a cylindrical head 63, able to be housed within the passage 24 of the shaft 21 of the cap 2, and being placed on the step 27 formed by said passage and the adjacent passage 25. And at the top it has a hexagonal space 64, suitable for receiving a key for its manipulation, but which as will be understood this is not an indispensable requirement, as it could have any other conventional means of being manipulated.

So, for the assembly and compacting of the whole thing we proceed to place one of the printed circuits, circuit 5, on the shaft 11 and on the cylindrical objects 16, aligning their circular passage 54 with the passage 13 of said shaft 11, so that its peripheral edge is placed on the surface of the end of the horn 12 of this, and the basic substratum 51, through the reserves 56 of the printed circuit on its inferior surface 53, on the stubs 17. Next the separating object is placed on top 3, aligning its assistant passage 34 with the circular passage 54 of the printed circuit 5, so that the end of the protuberances by way of horns 32 are placed on the periphery of the edge of said circular passage 54, and the troncoconic protuberances 33 on the printed circuit of the upper surface, 52, proceeding with the other printed circuit, circuit 4, in the same way. Next the cap 2 is placed on the whole which is thereby formed, so that the furthest end of the trumpet-shaped portion 23 is placed on the periphery of the circular passage 44 of the circuit 4, and the stubs 26 of the cylindrical objects 22, through the reserves 46 of the printed circuit 4 on the basic substratum 41.

Subsequently the screw 6 is introduced so that its threaded portion 61 is housed within the threaded passage 14 of the shaft 11 of the body of the box 1, and up to its head 63 is placed on the step 27 of the shaft 21, from which as it is being threaded both shafts will approach each other, 11 and 21, which will exercise a compression on the intervening elements, achieving in this way a permanent fixing for the whole thing.

Additionally, brackets or similar items 7 will be placed on the ends of the printed circuit boards, 4 and 5, with the aim of preventing any gyrating oscillation of said boards.

Certain changes, modifications or variations may be added to the method described, as the detail of the above is only for illustration purposes and is not binding. It is intended that all these changes and others that may be thought of by people skilled in the art, are included within this document, as long as it does not exceed the spirit and widest scope of the following claims.

What is claimed is:

1. An electrical distribution box with compacting system for its integral elements, suitable for being used in a vehicle, comprising:
    a box having a body, and a cooperating fixing means protruding from a bottom surface of said body;
    first and second printed circuit boards which make up an electrical distribution system of the vehicle positioned within said body;
    a lid for providing said body with an isolation for its internal field, and a cooperating fixing means protruding from a bottom surface of said lid;
    a separating element in a form of a laminated board, said separating element interposed between said first and second printed circuit boards, said separating element has on each one of its surfaces a protuberance in a form of a horn, and a plurality of troncoconic protuberances for coming into contact with said first and second printed circuit boards and providing a space between said first and second printed circuit boards and the separating element; and
    wherein said cooperating fixing means of the body, said cooperating fixing means of the lid and said horns are in coaxial alignment.

2. The electrical distribution box, according to claim 1, wherein the cooperating fixing means of the body comprises a centered and solitary vertical shaft for providing a support base to the first and second printed circuit boards and establishing a separation between the body and said second printed circuit board.

3. The electrical distribution box, according to claim 2, wherein the bottom surface of the body having a plurality of cylindrical objects distributed jointly on the aforementioned bottom surface for cooperating in the maintenance of the first and second printed circuit boards, and exerting pressure on them.

4. The electrical distribution box, according to claim 2, wherein the vertical shaft having a threaded blind passage for receiving a thread as a means of tightening.

5. The electrical distribution box, according to claim 4, wherein said tightening means comprises a screw.

6. The electrical distribution box, according to claim 5, wherein the cooperating fixing means of the lid comprises a solitary shaft, said shaft having an assistant axial passage, said assistant axial passage having an enlarged portion adjacent to an external surface of said assistant axial passage.

7. The electrical distribution box, according to claim 6, wherein a portion of said assistant axial passage for receiving a body of said screw and the enlarged portion of said passage for housing a head of said screw.

8. The electrical distribution box, according to claim 7, wherein said shaft of said lid establishes a separation between the second printed circuit board and the bottom surface of the lid, wherein the bottom surface of the lid having a plurality of cylindrical objects distributed jointly on the aforementioned bottom surface for cooperating in the maintenance of the aforementioned boards, and exerting pressure on them.

9. The electrical distribution box, according to claim 8, wherein each of the first and second printed circuit boards has a passage for allowing the body of said screw through.

10. The electrical distribution box, according to claim 9, wherein the printed circuit boards have non-conductive portions for allowing contact with the cylindrical objects of the body and the lid and said troncoconic protuberances of said separating element.

11. The electrical distribution box, according to claim 10, wherein said screw has a cylindrical body, a cylindrical head and a threaded end, for being introduced into the lowest diameter passage of the shaft of the lid element, through the first printed circuit board, between the separating element and through the second printed circuit board, until the threaded end is housed in the threaded blind passage of the shaft of the body, and the cylindrical head supported by the enlarged portion on the assistant axial passage of the shaft of the lid, and exerting traction on the body so that between both shafts, they put pressure on the intervening boards and separating element, creating a compacting between them, helped by the cylindrical objects.

* * * * *